(12) United States Patent
Angyal et al.

(10) Patent No.: US 8,927,442 B1
(45) Date of Patent: Jan. 6, 2015

(54) SICOH HARDMASK WITH GRADED TRANSITION LAYERS

(71) Applicant: International Business Machines Corporation, Armonk, NY (US)

(72) Inventors: Matthew S. Angyal, Stormville, NY (US); Yannick S. Loquet, Cohoes, NY (US); Yann A. Mignot, Slingerlands, NY (US); Son V. Nguyen, Schenectady, NY (US); Muthumanickam Sankarapandian, Niskayuna, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/951,321

(22) Filed: Jul. 25, 2013

(51) Int. Cl.
*H01L 21/469* (2006.01)
*H01L 23/58* (2006.01)

(52) U.S. Cl.
USPC .......................................... 438/786; 257/639

(58) Field of Classification Search
USPC .......... 438/736, 761, 768–790; 257/637–639, 257/E21.023–E21.038
See application file for complete search history.

(56) References Cited

U.S. PATENT DOCUMENTS

| | | | | |
|---|---|---|---|---|
| 5,616,401 | A | * | 4/1997 | Kobayashi et al. ........... 428/212 |
| 6,429,538 | B1 | | 8/2002 | Lin |
| 6,518,200 | B2 | * | 2/2003 | Lin ............................... 438/761 |
| 6,875,664 | B1 | | 4/2005 | Huang et al. |
| 6,927,178 | B2 | | 8/2005 | Kim et al. |
| 6,960,519 | B1 | * | 11/2005 | Dalton et al. ................. 438/617 |
| 7,915,180 | B2 | | 3/2011 | Gates et al. |
| 8,183,149 | B1 | * | 5/2012 | Permana et al. .............. 438/623 |
| 2006/0091559 | A1 | | 5/2006 | Nguyen et al. |
| 2010/0009161 | A1 | | 1/2010 | Edelstein et al. |
| 2012/0276752 | A1 | | 11/2012 | Rangarajan et al. |
| 2012/0329287 | A1 | | 12/2012 | Gates et al. |

* cited by examiner

*Primary Examiner* — Calvin Lee
(74) *Attorney, Agent, or Firm* — Steven Kellner; Yuanmin Cai (57) ABSTRACT

A structure and method for fabricating an improved SiCOH hardmask with graded transition layers having an improved profile for forming sub-20 nm back end of the line (BEOL) metallized interconnects are provided. In one embodiment, the improved hardmask may be comprised of five layers: an oxide adhesion layer, a graded transition layer, a dielectric layer, an inverse graded transition layer, and an oxide layer. In another embodiment, the improved hardmask may be comprised of four layers; an oxide adhesion layer, a graded transition layer, a dielectric layer, and an oxide layer. In another embodiment, a method of forming an improved hardmask may comprise a continuous five step plasma enhanced chemical vapor deposition (PECVD) process utilizing a silicon precursor, a porogen, and oxygen. In yet another embodiment, a method of forming an improved hardmask may comprise a continuous four step PECVD process utilizing a silicon precursor, a porogen, and oxygen.

10 Claims, 7 Drawing Sheets

SICOH HARDMASK WITH GRADED TRANSITION LAYERS

FIELD OF THE INVENTION

The present invention relates generally to the fabrication of integrated circuits, and more particularly, to a structure and method for fabricating an improved SiCOH hardmask with graded transition layers and having an improved profile for forming sub-20 nm back end of the line (BEOL) metallized interconnects.

BACKGROUND OF INVENTION

As integrated circuit (IC) features continue to be scaled down to deep submicrometer (μm) dimensions (0.05-0.20 μm), metal interconnects become a bottleneck for continued IC performance improvement. Within a typical interconnect structure, metal vias run perpendicular to the silicon substrate and metal lines run parallel to the silicon substrate. Efficient routing of these signals across the device requires formation of multilevel or multilayered interconnect schemes, such as, for example, dual damascene wiring structures based on copper. Copper based interconnect structures are desirable over previously used aluminum interconnects due to their efficacy in providing high speed signal transmission between large numbers of transistors on a complex semiconductor chip.

Further enhancement of the signal speed and reduction of signals in adjacent metal lines (known as "crosstalk") can be achieved by embedding the metal lines and vias in a low-k dielectric material having a dielectric constant of approximately 3.9 or less, or in an ultra low-k (ULK) dielectric material having a dielectric constant of approximately 3.0 or less. One method for forming vertical and horizontal interconnects is by using damascene or dual damascene method. In the damascene method, one or more dielectric materials, including low-k dielectric materials, are deposited and pattern etched to form vias and lines. Conductive materials such as copper and barrier layer materials used to prevent diffusion of copper into the surrounding low-k dielectric material are then inlaid into the etched pattern. Any excess copper and barrier layer materials external to the etched pattern remaining on the field of the substrate are then removed.

However, reliability problems are associated with these structures. During integration, reliability stress, or extended use, a chip interconnect structure made in a low-k dielectric material may fail or degrade due to poor adhesion, moisture uptake, and various stress migration between the metal liner/metal and the low-k dielectric material. These reliability issues result from defects in the porous low-k dielectric material and the metal liner/metal of the interconnects, which results in oxidizing species such as $H_2O$ or $O_2$ interacting with the metal. The varying compositions and material properties of the various deposition layers used in conventional hardmasks (oxide adhesion layer, transitional layer, low-k/UK dielectric layer, and layers of oxygen-containing organosilicon compounds) make it difficult to form defect free lines and vias. During the etching process, the various hardmask layers react differently to the etchants, resulting in interconnects that have a rough or uneven profile (e.g., undercut profile) that negatively affects performance. In addition to these integration problems, conventional processes used to form hardmasks involve multiple tool sets and several steps in which the process conditions must be altered.

Accordingly, it may be desirable to overcome the deficiencies and limitations described hereinabove.

SUMMARY

According to one embodiment of the present invention, the structure of an improved SiCOH hardmask with a graded transition layer and an inverse graded transition layer is provided. The improved hardmask structure may include an oxide adhesion layer comprising an oxygen rich silicon oxide formed on a surface of a substrate. The substrate may be a semiconducting material, an insulating material, a conductive material, or a combination thereof. The improved hardmask may also include a graded transition layer formed on the oxide adhesion layer. The graded transition layer may have a high concentration of oxygen in the region contacting the oxide adhesion layer and a gradually decreasing concentration of oxygen towards an upper surface. The improved hardmask may also include a dielectric layer formed on the graded transition layer and an inverse graded transition layer formed on the dielectric layer. The inverse graded transition layer may have a low concentration of oxygen in the region contacting the dielectric layer and an increasing concentration of oxygen towards an upper surface. The improved hardmask may also include an oxide layer comprising oxygen rich silicon oxide formed on the inverse graded transition layer.

According to another embodiment of the present invention, the structure of an improved SiCOH hardmask with only a graded transition layer is provided. The improved hardmask structure may include an oxide adhesion layer comprising an oxygen rich silicon oxide formed on a surface of a substrate. The substrate may be a semiconducting material, an insulating material, a conductive material, or a combination thereof. The improved hardmask may also include a graded transition layer formed on the oxide adhesion layer. The graded transition layer may have a high concentration of oxygen in the region contacting the oxide adhesion layer and a gradually decreasing concentration of oxygen towards an upper surface. The improved hardmask may also include a dielectric layer formed on the graded transition and an oxide layer comprising oxygen rich silicon oxide formed on the dielectric layer.

In yet another embodiment of the present invention, a method for forming an improved SiCOH hardmask with a graded transition layer and an inverse graded transition layer is provided. The method of forming the improved hardmask may comprise a continuous plasma enhanced chemical vapor deposition (PECVD) process utilizing a silicon precursor, a porogen, and oxygen having five steps. In the first step, an oxide adhesion layer comprising an oxygen rich silicon oxide may be formed on the surface of a substrate. The substrate may be a semiconducting material, an insulating material, a conductive material, or a combination thereof. In the second step, a graded transition layer may be formed on the oxide adhesion layer. The graded transition layer may have a high concentration of oxygen in the region contacting the oxide adhesion layer and a gradually decreasing concentration of oxygen towards upper surface. In the third step, a dielectric layer may be formed on the graded transition layer. In the fourth step, an inverse graded transition layer may be formed on the dielectric layer. The inverse graded transition layer may have a low concentration of oxygen in the region contacting the dielectric layer and a gradually increasing concentration of oxygen towards an upper surface. In the fifth step, an oxide layer may be formed on the inverse graded transition layer. The oxide layer may be comprised of an oxygen rich silicon oxide. In another embodiment, a method of forming an improved SiCOH hardmask with only a graded transition layer is provided similar to the previous embodiment in which there is no fourth step.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

The embodiments of the present invention relate generally to the fabrication of integrated circuits, and more particularly to a structure and method for fabricating an improved SiCOH hardmask with graded transition layers and having an improved profile for forming sub-20 nm back end of the line (BEOL) metallized interconnects.

Figure 1:
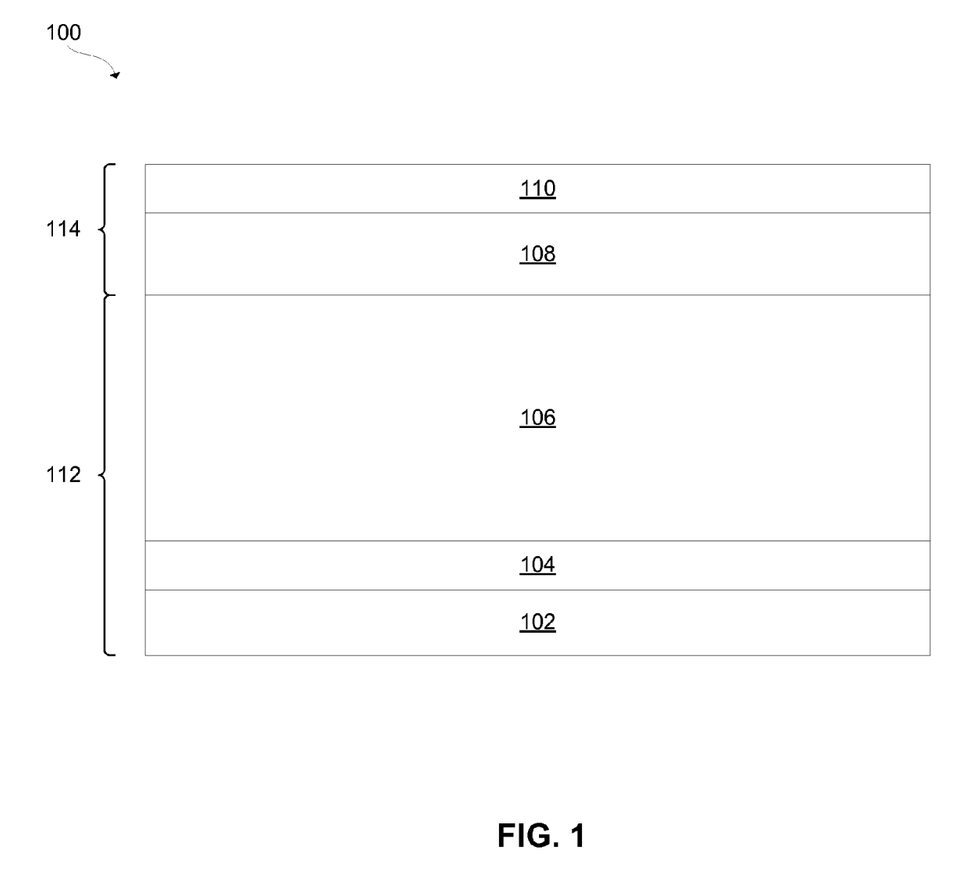
FIG. 1 is a cross-sectional view of a conventional hardmask structure formed by conventional methods.

By way of example, FIG. 1 is illustrative of a conventional hardmask structure 100 formed by deposition methods known in the art, such as, for example, chemical vapor deposition (CVD), plasma enhanced chemical vapor deposition (PECVD), high-density plasma (HDP) deposition, pulsed PECVD, spin-on applications, or sputtering methods. Typically, a dielectric stack 112 is formed on the surface of a substrate and a hardmask stack 114 is formed over the dielectric stack 112. To form the dielectric stack 112 a silicon precursor is used to form a graded oxide which functions as an oxide adhesion layer 102. The oxide adhesion layer 102 enables the hardmask structure 100 to adhere to the surface of a substrate. After the oxide adhesion layer 102 is formed, the process parameters are changed, reducing oxygen flow while introducing flow of a low-k dielectric to form an oxide low-k transition layer 104. The low-k dielectric material can be porous or non-porous. A low-k dielectric layer 106 is then formed using the silicon precursor and an organic porogen. Thermal cure or UV cure is then performed to generate increased porosity in the dielectric stack 112 to reduce the conductivity and achieve a low-k or ULK film.

After the porous dielectric stack 112 is formed, different tool sets and processes are used to form a hardmask stack 114 over the dielectric stack 112. Typically, the hardmask stack 114 is comprised of a lower hardmask layer 108 and an upper hardmask layer 110. The lower hardmask layer 108 comprises a hermetic oxide material such as octamethylcyclotetrasiloxane (OMCTS). The term "hermetic" is used herein to denote that the lower hardmask layer 108 is substantially impervious to external influences such as air or moisture, providing a sealing layer that prevents air or moisture from penetrating into the dielectric stack 112. The upper hardmask layer 110 serves as a chemical mechanical polishing (CMP) etch stop layer and typically comprises an organosilicate such as tetraethyl orthosilicate (TEOS).

Figure 2:
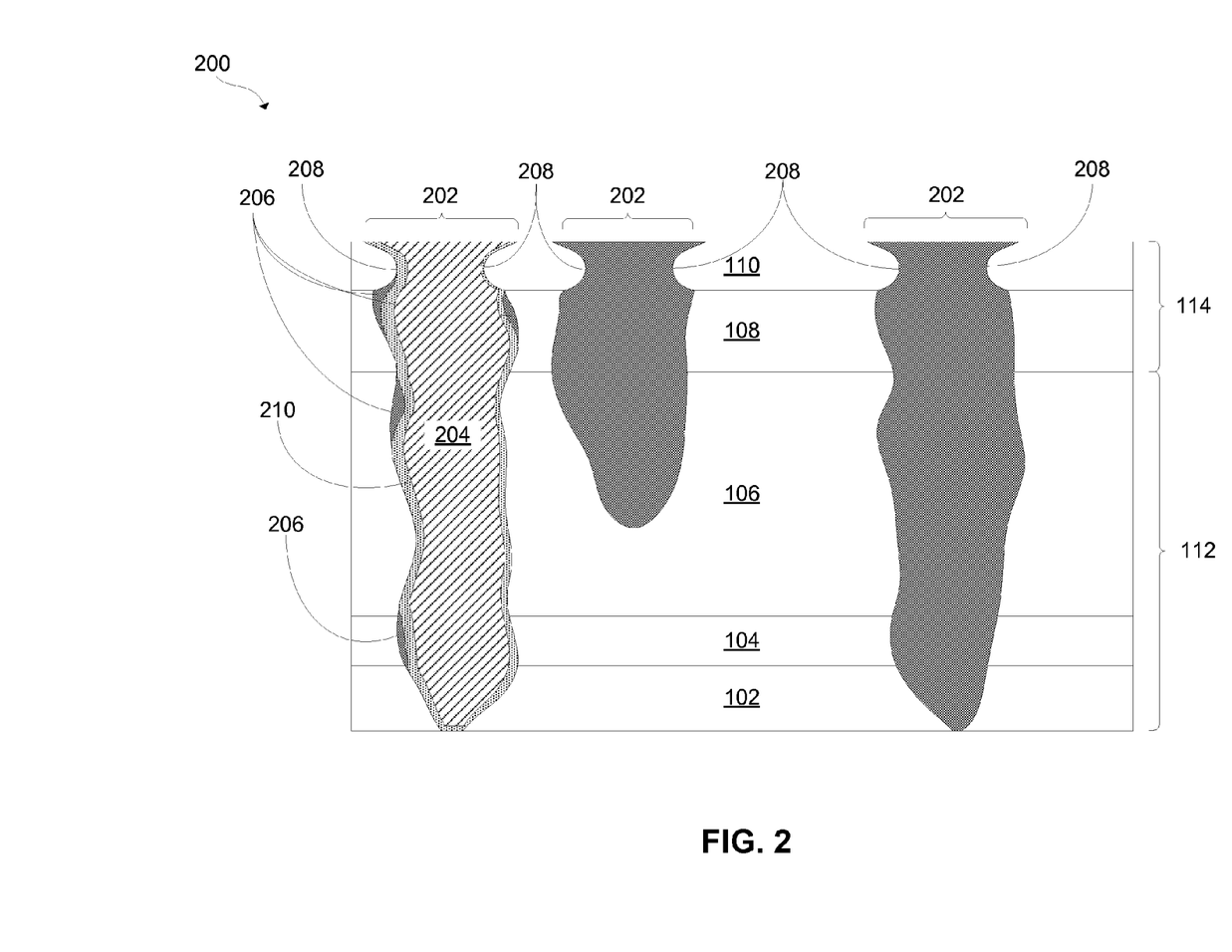
FIG. 2 is a cross-sectional view depicting the irregular and undercut profiles of conventional contact vias and an electrical contact formed in a conventional hardmask

By way of example, FIG. 2 is illustrative of the problems associated with forming interconnects in conventional hardmasks. Structure 200 shows typical contact vias 202 formed through a conventional hardmask. Because of the differing compositions and material properties of the dielectric stack 112 and hardmask stack 114, the contact vias 202 may develop uneven sidewalls during the etching process. Because of these uneven sidewall regions, sidewall gaps 206 may form after the contact vias 202 are filled with liners 210 and metal contacts 204. In addition, the upper hardmask layer 110 typically has a low wet etch rate during post reactive ion etching (RIE) dilute HF (DHF) cleaning compared to that of the lower hardmask layer 108, resulting in an undercut profile 208. The sidewall gaps 206 and undercut profile 208 allow oxidizing species such as $H_2O$ or $O_2$ to interact with the metal contacts, which negatively impacts performance. In addition, separate process steps and tool sets are required to form the hardmask stack 114 over the dielectric stack 112.

Exemplary embodiments of the present invention by which to reduce the uneven and undercut profiles of contact vias and to eliminate the need for additional process steps and tool sets during hardmask formation is described in detail below by referring to the accompanying FIGS. 3-7.

Figure 3:
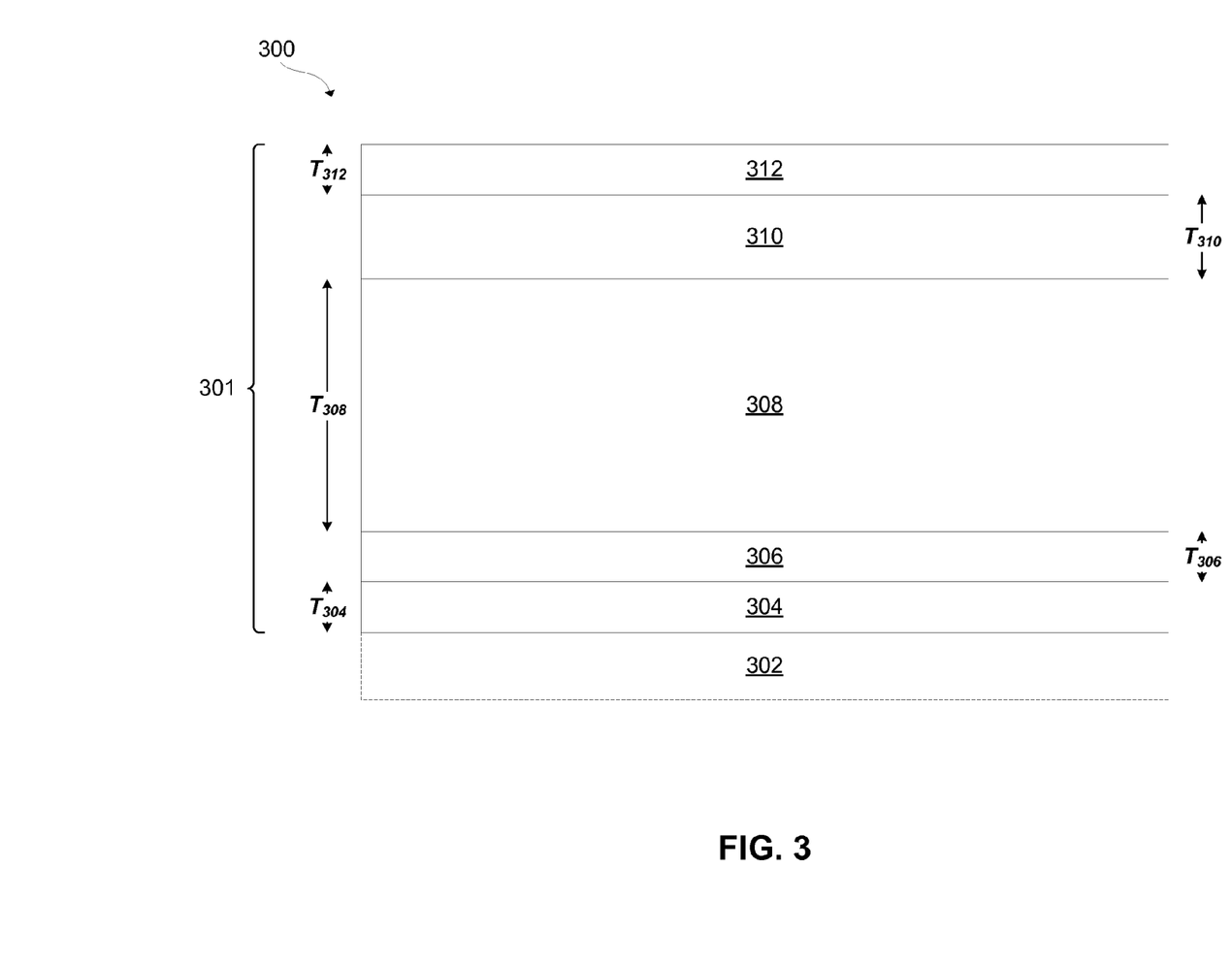
FIG. 3 is a cross-sectional view of an improved hardmask containing a graded transition layer and a graded inverse transition layer, according to an embodiment of the present invention.

Referring to FIG. 3, structure 300 is illustrative of a preferred embodiment of the present invention. Structure 300 is a cross-sectional view of an improved hardmask 301 formed over the surface of a substrate 302.

First, an oxide adhesion layer 304 may be formed on the surface of a substrate 302. The oxide adhesion layer 304 enables the improved hardmask 301 to adhere to substrate 302. Substrate 302 may include a semiconducting material, an insulating material, a conductive material, or any combination thereof, including multilayered structures. Thus, for example, substrate 302 can be a semiconducting material such as Si, SiGe, SiC, GaAs, InAs, InP, and other III/V or II/VI compound semiconductors. The semiconductor substrate may also include a layered substrate such as, for example, Si/SiGe, Si/SiC, or semiconductor-on-insulators (SOIs). When substrate 302 is an insulating material, the insulating material can be an organic insulator, an inorganic insulator, or a combination thereof including multilayers.

When substrate 302 is a conductive material, the substrate 302 may include, for example, polySi, an elemental metal, alloys of elemental metals, a metal silicide, a metal nitride, and combinations thereof, including multilayers. When substrate 302 comprises a semiconductor material, one or more semiconductor devices such as complimentary metal oxide semiconductor (CMOS) devices can be fabricated thereon. For clarity, the one or more semiconductor devices are not shown in the drawings of the present application.

The oxide adhesion layer 304 may be comprised of silicon oxide. In some embodiments, the oxide adhesion layer 304 may also include small amounts of C. The concentration of C in the oxide adhesion layer 304 may be less than approximately 16 atomic percent. The oxide adhesion layer 304 may have a thickness $T_{304}$ of approximately 1 nm to approximately 10 nm. In a preferred embodiment the oxide adhesion layer 304 may have a thickness $T_{304}$ of approximately 2 nm to approximately 4 nm. The oxide adhesion layer 304 may have a composition that is approximately 33 atomic percent Si, approximately 50 atomic percent to approximately 66 atomic percent O, and approximately 0 atomic percent to approximately 17 atomic percent C.

A graded transition layer 306 may be formed over the oxide adhesion layer 304. The graded transition layer 306 may be a graded layer comprised of Si, O, C, and H, with a lower O concentration towards the upper surface of the graded transition layer 306 than the lower surface. The transition layer 306 may have a thickness $T_{306}$ of approximately 1 nm to approximately 50 nm. It should be noted that the composition of H in the graded transition layer 306 may vary with depth thickness due to the high mobility of H in the film. In a preferred embodiment the graded transition layer 306 may have a thickness $T_{306}$ of approximately 2 nm to approximately 30 nm. The graded transition layer 306 may have a composition (that varies according to depth) of approximately 20 atomic percent to approximately 33 atomic percent Si, approximately 20 atomic percent to approximately 66 atomic percent O, and approximately 1 atomic percent to approximately 60 atomic percent C.

A dielectric layer 308 may be formed over the transition layer 306. The dielectric layer 308 may be comprised of a low-k or ULK dielectric material. In a preferred embodiment, the dielectric layer 308 may be a SiCOH dielectric having a dielectric constant of not more than approximately 3.2 and which exhibits very low crack propagation velocities when subjected to operating heat and wear. The dielectric material may be porous or nonporous. When porous dielectric films are employed, the dielectric constant thereof is less than the nonporous version of the same dielectric film in the range of less than 3.0. Preferably, the dielectric layer 308 is comprised of a porous material. The dielectric layer 308 may have a thickness $T_{308}$ of approximately 25 nm to approximately 750 nm. In a preferred embodiment the dielectric layer 308 may have a thickness $T_{308}$ of approximately 50 nm to approximately 500 nm. The dielectric layer 308 may have a composition of approximately 20 atomic percent to approximately 35 atomic percent Si, approximately 30 atomic percent to approximately 51 atomic percent O, and approximately 14 atomic percent to approximately 50 atomic percent C.

An inverse graded transition layer 310 may be formed over the dielectric layer 308. The inverse graded transition layer 310 may have a similar composition to the graded transition layer 306 with an inverse and symmetrical gradient of O composition (i.e., a higher concentration of O at the upper surface of the inverse graded transition layer 308 than at the lower surface). The inverse graded transition layer 310 may have a thickness $T_{310}$ of approximately 1 nm to approximately 20 nm. In a preferred embodiment the inverse graded transition layer 310 may have a thickness $T_{310}$ of approximately 1 nm to approximately 10 nm. The inverse graded transition layer 310 may have a composition (that varies according to depth) of approximately 20 atomic percent to approximately 33 atomic percent Si, approximately 20 atomic percent to approximately 66 atomic percent O, and approximately 1 atomic percent to approximately 60 atomic percent C.

An oxide layer 312 may be formed over the inverse graded transition layer 310. The oxide layer 312 may have a thickness $T_{312}$ of approximately 5 nm to approximately 50 nm. In a preferred embodiment the oxide layer 312 may have a thickness $T_{312}$ of approximately 10 nm to approximately 40 nm. The oxide layer 312 may have a composition of approximately 33 atomic percent Si, approximately 50 atomic percent to approximately 66 atomic percent O, and approximately 0 atomic percent to approximately 17 atomic percent C.

Figure 4:
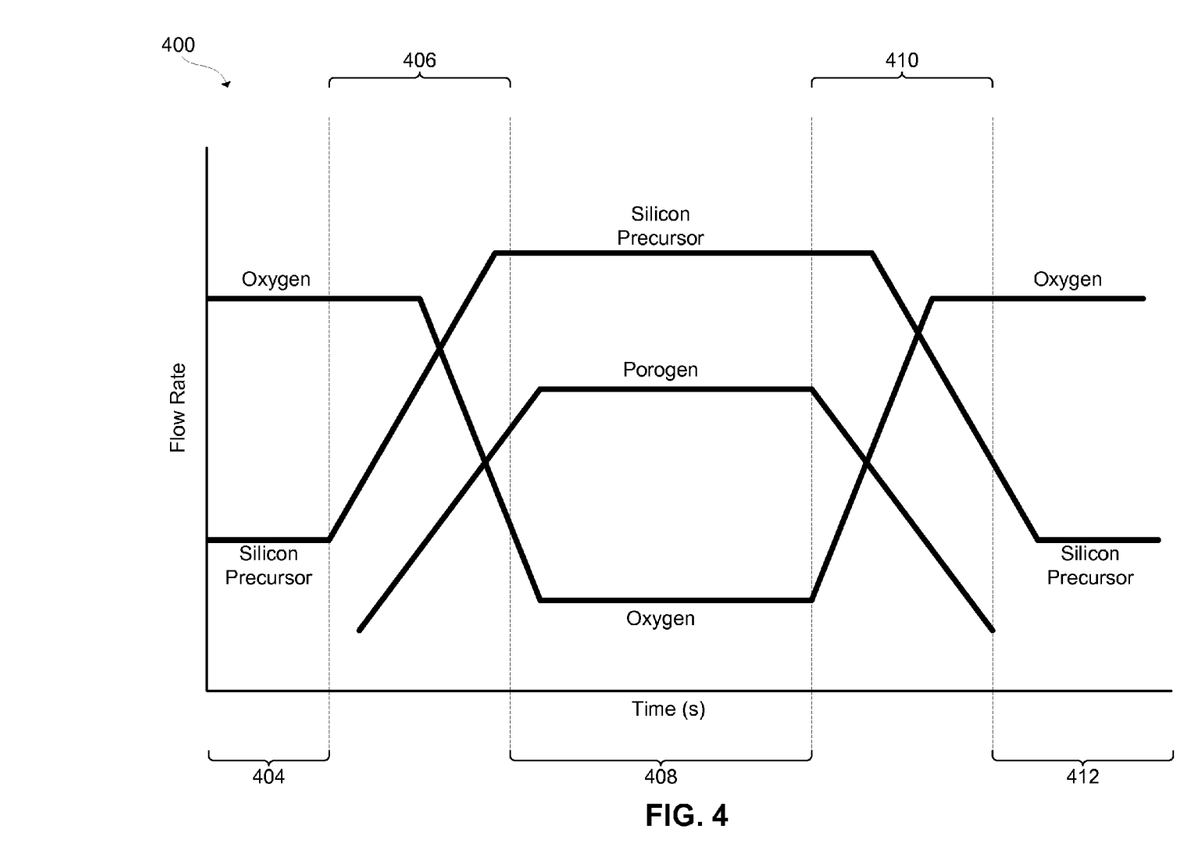
FIG. 4 is a graph of flow rate versus time for the formation of an improved hardmask, according to an embodiment of the present invention.

Referring to FIG. 4, chart 400 is illustrative of a process flowchart which may be used to form of the improved hardmask 301 (shown in FIG. 3). The improved hardmask 301 (shown in FIG. 3) may be formed in a single deposition process by any deposition method known in the art, such as, but not limited to CVD, HDP, pulsed PECVD, spin-on applications, or sputtering methods. In a preferred embodiment, structure 300 (shown in FIG. 3) is formed by PECVD deposition.

The oxide adhesion layer 304 (shown in FIG. 3) may be formed during the first step 404 of the deposition process. The oxide adhesion layer 304 (shown in FIG. 3) may be formed by the reaction of a silicon precursor with a high flow of oxygen. The silicon precursor may be introduced in a gaseous or liquid state and may be comprised of atoms of Si, C, O, H, along with an inert carrier such as He or Ar. The silicon precursor and oxygen may be introduced into a reactor, preferably a PECVD reactor, and the resulting film may be deposited onto a suitable substrate, as defined above, to form the oxide adhesion layer 304 (shown in FIG. 3) utilizing conditions that are effective in forming SiOx.

The silicon precursor may be selected from silane ($SiH_4$) derivatives having the molecular formula SiRR'R"R'". where R, R', R", and R'" may or may not be identical and are selected from H, alkyl, and alkoxy, preferably methyl, ethyl, methoxyl, and ethoxyl. Preferably, the silicon precursor is selected from organic molecules with ring structures comprising SiCOH components such as: 1,3,5,7-tetramethylcyclotrasiloxane (TMCTS or $CH_4H_{16}O_4Si_4$), octamethylcyclotetrasiloxane (OMCTS), diethoxymethysilane (DEMS), dimethyldimethoxysilane (DMDMOS), diethylmethoxysilane (DEDMOS), cyclic dimethylsilacyclopentane (DMSCP) and related cyclic and non-cyclic silanes, siloxanes, and the like. In another embodiment, the silicon precursor may have the molecular formula such RR'R'Si—CH2-SiRR'R", where R, R', and R" may or may not be identical and are selected from H, alkyl, and alkoxy, preferably methyl, ethyl, methoxyl, and ethoxyl. The flow rate of oxygen may be approximately 50 sccm to 1000 sccm. The flow rate of the silicon precursor may be approximately 300 mgm. The flow rate of the He carrier may be approximately 5,000 mgm. The first step 404 of the deposition process may have a duration of approximately 0.5 s to approximately 2 s. In a preferred embodiment, the first step 404 of the deposition process may have a duration of approximately 0.5 s to approximately 1 s.

During the second step 406 of the deposition process, the graded transition layer 306 (shown in FIG. 3) may be formed. During the second step 406 of the deposition process, the flow rate of the silicon precursor is ramped up from the flow rate in the first step 404 to approximately 400 mgm to approximately 1000 mgm, while the flow rate of oxygen is reduced from the flow rate in the first step 404 to approximately 450 sccm to approximately 300 sccm. The reduction of the flow rate of oxygen in the second step 406 results in the graded transition layer 306 (shown in FIG. 3) having a higher concentration of oxygen in the region contacting the oxide adhesion layer 304 (shown in FIG. 3) than at the upper surface of the graded transition layer 306 (shown in FIG. 3). This composition gradient provides for more uniformity of composition in the improved hardmask 301 (shown in FIG. 3). In addition, a porogen may be introduced with a flow rate that ramps up to approximately 0 mgm to approximately 1360 mgm before the end of the second step 406 of the deposition process. The porogen may cause subsequent pore formation in the resulting dielectric layer 308 (shown in FIG. 3) during a subsequent curing step.

The porogen may be any hydrocarbon that can be delivered to the reaction chamber and which can be dissociated during the PECVD process at a radio-frequency (RF) power low enough that the dielectric properties of the dielectric layer 308 (shown in FIG. 3) are not degraded and can be used to form the porogen phases. Examples of these porogen precursors may include cyclic unsaturated hydrocarbons, linear alkenes, and molecules with strained rings such as cycloalkene oxides. In an embodiment, the porogen precursor may comprise an organic compound such as, but not limited to, a-terpinene (ATRP), methylmethacrylate (MMA), bicycloheptadiene (BCHD), and hexadiene (HXD).

In another embodiment, a sacrificial organic porogen group may be present as an R group on the silicon precursor. In a preferred embodiment, the R group is selected from branched alkyl, cyclic alkyl, branched alkoxy, cyclic alkoxy, aldehydes, ketones, esters, thioesters, amines, urethanes, nitrites, azo derivatives, triphenyl, cycloheptatrienyl, and alkyl groups which are connected to Si by the linker group. The linker group, connected to Si, may itself be thermally/photochemically labile or provide a platform to which labile substituents can be attached (e.g., hydroxyethyl, hydroxypropyl, aminoethyl, aminopropyl, carboxyethyl, carboxypropyl, branched functional tethers, etc.). Typically, the functionality bound by the linker group will be sensitive to heat, light, ionizing radiation, or catalytic reagents. The labile group may be directly bonded to Si without a linker (e.g., branched alkoxy, etc.) such that the alkyl substituent is removed upon thermal/photochemical treatment leading to a silanol that undergoes subsequent condensation into the matrix.

The second step 406 may last for a duration of approximately 0.5 s to 5 s. In a preferred embodiment, the second step 406 may last for a duration of approximately 1 s to 3 s.

After the graded transition layer 306 (shown in FIG. 3) is formed during the second step 406 of the deposition process, the dielectric layer 308 (shown in FIG. 3) may be formed in the third step 408 by maintaining the flow rate of the silicon precursor at approximately 1500 mgm to approximately 3000 mgm, the flow rate of the porogen at approximately 500 mgm to approximately 2000 mgm, and the flow rate of oxygen at approximately 100 sccm to approximately 600 sccm for approximately 5 s to approximately 50 s. In a preferred embodiment, the length of third step 408 may be approximately 10 s to approximately 40 s.

After the dielectric layer 308 (shown in FIG. 3) is formed, the inverse graded transition layer 310 (shown in FIG. 3) may be formed in the fourth step 410 of the deposition process. During the fourth step 410 the flow rates of the silicon precursor and porogen are decreased and the flow rate of oxygen is increased. The flow rate of the silicon precursor may be decreased from the flow rate in the third step 408 to a flow rate of approximately 1000 mgm to approximately 400 mgm. The flow rate of the porogen may be decreased from the flow rate in the third step 408 to a flow rate of approximately 1360 mgm to approximately 0 mgm. The flow rate of oxygen may be increased from the flow rate in the third step 408 to approximately 300 sccm to approximately 450 sccm. The increase in the flow rate of oxygen in the fourth step 410 results in the inverse graded transition layer 310 (shown in FIG. 3) having a lower concentration of oxygen in the region contacting the dielectric layer 308 (shown in FIG. 3) than at the upper surface of the inverse graded transition layer 310 (shown in FIG. 3). This composition gradient provides for more uniformity of composition in the improved hardmask 301 (shown in FIG. 3). The fourth step 410 may last for a duration of approximately 0.5 s to 5 s. In a preferred embodiment, the fourth step 410 may last for a duration of approximately 1 s to 3 s.

After the inverse graded transition layer 310 is formed in the fourth step 410 of the deposition process, the flow of porogen into the reaction chamber may be ceased, and the flow rates of oxygen and the silicon precursor may be held at a steady rate during the fifth step 412 to form the oxide layer 312 (shown in FIG. 3). The flow rate of oxygen may be approximately 200 sccm to approximately 800 sccm. The flow rate of the silicon precursor may be approximately 200 mgm to approximately 600 mgm. The fifth step 412 may last for a duration of approximately 0.5 s to approximately 30 s. In a preferred embodiment, the fifth step may last for a duration of approximately 1 s to approximately 20 s.

Figure 5:
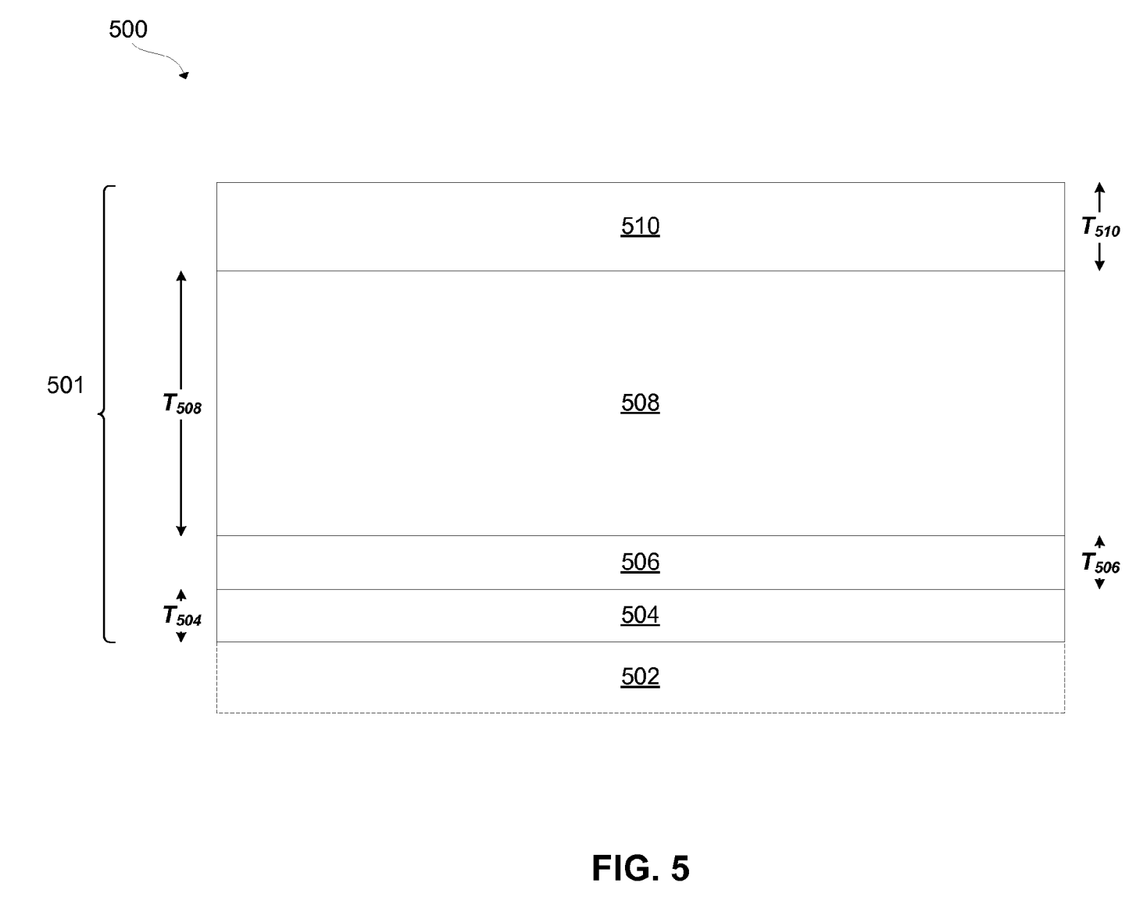
FIG. 5 is a cross-sectional view of an improved hardmask containing a graded transition layer, according to an embodiment of the present invention.

Referring now to FIG. 5, and in another embodiment, structure 500 depicts an improved hardmask 501 formed without the inverse graded transition layer 310 (shown in FIG. 3). The substrate 502 may be comprised of the same materials as the substrate 302 (shown in FIG. 3) and formed in using the same processes and techniques described above in forming the substrate 302 (shown in FIG. 3) in reference to FIG. 3. The oxide adhesion layer 504 may be comprised of the same materials and have the same thickness $T_{504}$ as the oxide adhesion layer 304 (shown in FIG. 3) and formed in using the same processes and techniques described above in forming the oxide adhesion layer 304 (shown in FIG. 3) in reference to FIG. 3. The graded transition layer 506 may be comprised of the same materials and have the same thickness $T_{506}$ as the graded transition layer 306 (shown in FIG. 3) and formed in using the same processes and techniques described above in forming the graded transition layer 306 (shown in FIG. 3) in reference to FIG. 3. The dielectric layer 508 may be comprised of the same materials and have the same thickness $T_{508}$ as the dielectric layer 308 (shown in FIG. 3) and formed in using the same processes and techniques described above in forming the dielectric layer 308 (shown in FIG. 3) in reference to FIG. 3. The oxide layer 510 may be comprised of the same materials and have the same thickness $T_{510}$ as the oxide layer 312 (shown in FIG. 3) and formed in using the same processes and techniques described above in forming the oxide layer 312 (shown in FIG. 3) in reference to FIG. 3.

The improved hardmask 501 may be formed using the same processes and techniques described above in forming the improved hardmask 301 (shown in FIG. 3) in reference to FIG. 4 with one exception; to form the improved hardmask

501 without the inverse graded transition layer 310 (shown in FIG. 3), the duration of the fourth step 410 (shown in FIG. 4) of the deposition process may be reduced to approximately 0 s. This may be accomplished by ceasing the flow of porogen after the third step 408 (shown in FIG. 4) while simultaneously increasing the flow rate of oxygen to a level of approximately 400 sccm to approximately 450 sccm and decreasing the flow rate of the silicon precursor to a level of approximately 400 mgm to approximately 450 mgm in order to form the oxide layer 510.

Figure 6:
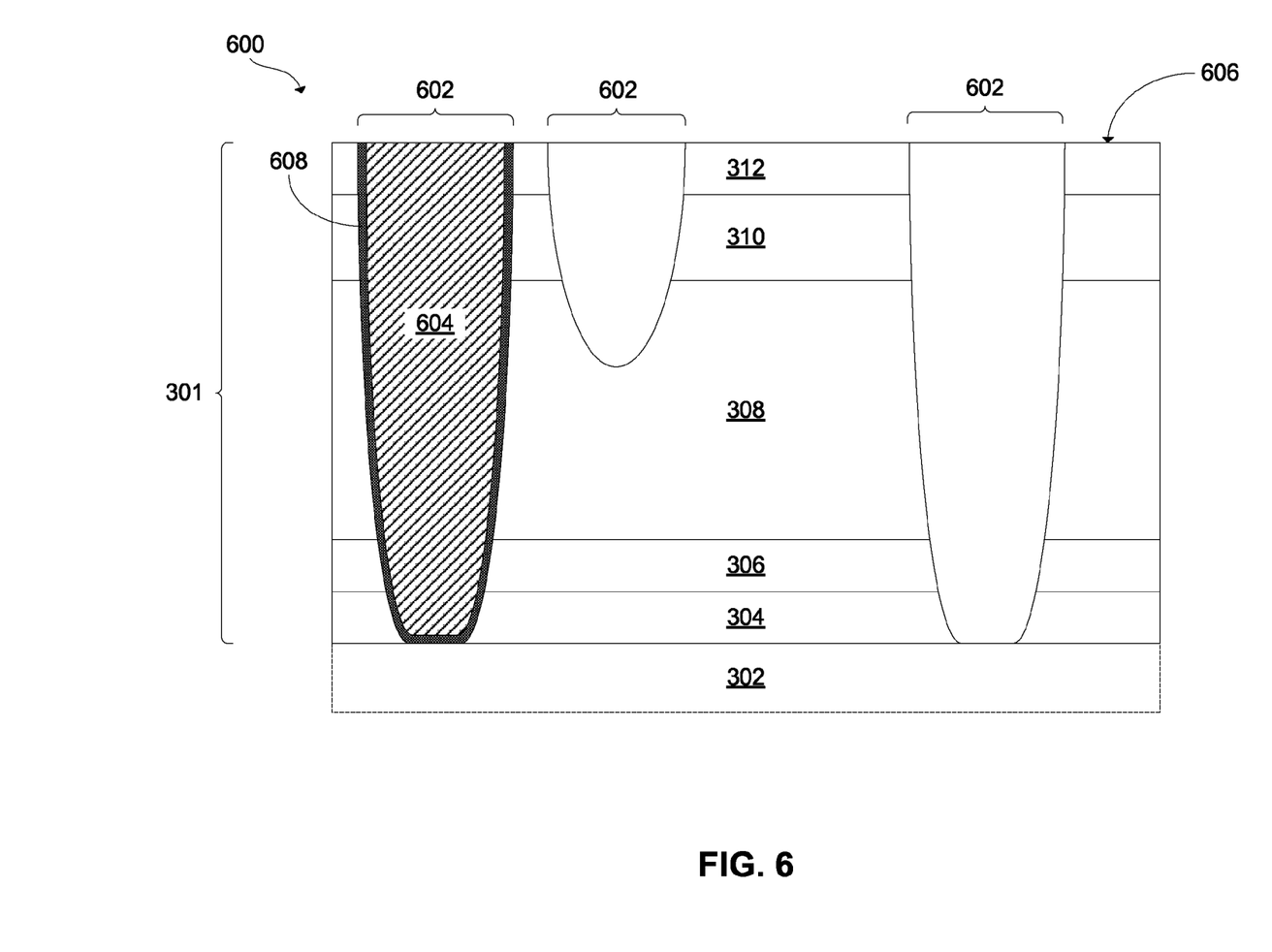
FIG. 6 is a cross-sectional view depicting the smooth profiles and lack of undercut in contact vias and an electrical contact formed in the improved hardmask containing a graded transition layer and a graded inverse transition layer, according to an embodiment of the present invention.

Referring to FIG. 6, structure 600 is illustrative of an embodiment of the present invention in which contact vias 602 and an electrical contact 604 have been formed in the improved hardmask 301 with the inverse graded transition layer 310. To form the contact vias 602 after providing the improved hardmask 301, a photoresist material (not shown) may be applied to the upper surface 606 of the improved hardmask 301 and then lithography may be used to provide a pattern into the photoresist material. The pattern formed at this point may be, but is not limited to, a via pattern. Although a via pattern is particularly described and illustrated at this point of the present invention, a line pattern may be formed instead. Next, the via pattern is transferred into the improved hardmask 301, including the dielectric layer 308, utilizing one or more etching steps. The patterned resist may be removed after the improved hardmask 301 is etched.

The etching steps may include a first etch that removes the exposed steps of the improved hardmask 301 not covered by the patterned photoresist material. The first etch may comprise a dry etching process such as reactive ion etching (RIE), ion beam etching, or plasma etching. After the improved hardmask 301 has been patterned, the patterned photoresist may be stripped and then a second etch may be used to form additional patterns. In some embodiments, the second patterning step is not used. When employed, the second patterning step comprises applying another resist material (not shown) to the structure 600 and then lithography is used to provide a line pattern which is transferred into the improved hardmask 301 utilizing an etching process that may include one or more dry etching steps. The line pattern is formed in a portion of the dielectric layer 308. In some embodiments of the present invention, the line can be formed first and then the via can be formed. In yet other embodiments, only a via or line opening is formed.

After the contact vias and/or lines are formed, electrical contacts 604 may be formed. In some embodiments, at least one liner 608 may be formed on the exposed surfaces of the contact vias 602. The liner 608 may be formed by any deposition process including, but not limited to, CVD, PECVD, sputtering, chemical solution deposition, or plating. The liner 608 may be comprised of any material that can serve as a barrier to prevent a conductive material from diffusing there through. Illustrative examples of such barrier materials include a refractory metal, such as Ti, Ta, W, Ru, or nitrides thereof (e.g., TiN, TaN, and WN). The liner 608 may also comprise TiNSi. In some embodiments, the electrical contacts 604 may be formed without the liner 608.

To form the electrical contacts 604, a conductive material may be deposited within the contact vias 602. The conductive material may be comprised of polySi, a conductive metal, an alloy comprising at least one conductive metal, a conductive metal silicide, or combinations thereof. Preferably, the conductive material may be comprised of a conductive metal, such as Cu, W, or Al. The conductive material may be formed within the contact vias 602 utilizing a conventional deposition process including, but not limited to, CVD, PECVD, sputtering, chemical solution deposition, or plating. After deposition, a planarization process may be employed such the upper surface of the electrical contacts 604 is substantially coplanar with the upper surface 606 of the improved hardmask 301. The above processing may be repeated any number of times to provide a multilevel interconnect structure.

Figure 7:
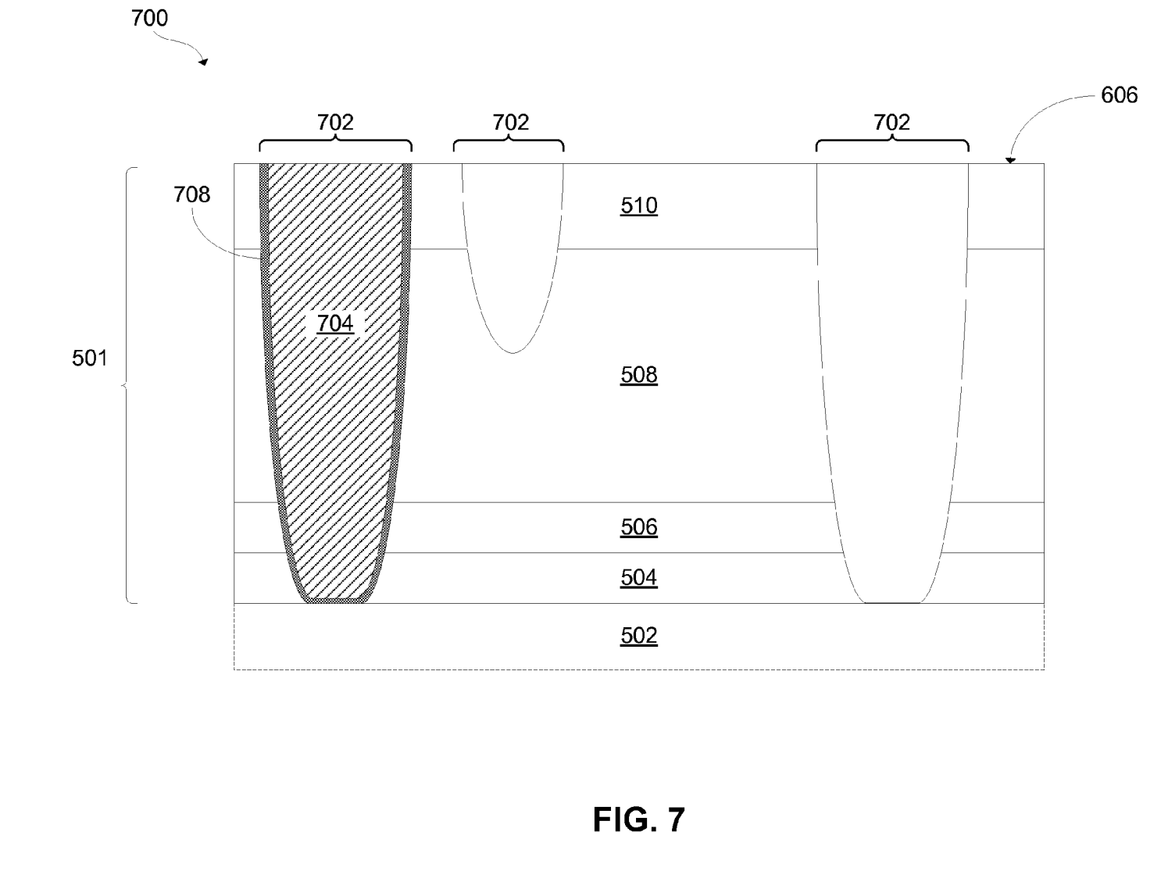
FIG. 7 is a cross-sectional view depicting the smooth profiles and lack of undercut in contact vias and an electrical contact formed in the improved hardmask containing a graded transition layer, according to an embodiment of the present invention.

Referring to FIG. 7, structure 700 is illustrative of an embodiment of the present invention in which contact vias 702 and an electrical contact 704 have been formed in the improved hardmask 501 without the inverse graded transition layer 310 (shown in FIG. 3). The contact vias 702 may be formed in using the same processes and techniques described above in forming the contact vias 602 in reference to FIG. 6. The liner 708 and electrical contact 704 may be comprised of the same materials as the liner 608 and electrical contact 604 and formed in using the same processes and techniques described above in forming the substrate the liner 608 and electrical contact 604 in reference to FIG. 6.

As shown in FIGS. 6-7, embodiments of the present invention of an improved SiCOH hardmask with at least one graded transition layer allow for a smooth etch profile when forming contact vias and electrical contacts because the layers of the improved hardmask have similar compositions and physical properties. In addition, the improved hardmask eliminates the undercut profile at the upper portion of contacts and vias formed in conventional hardmasks because the upper layers of the improved hardmask comprise an oxide layer (and in some embodiments an inverse transition layer) over the dielectric layer, instead of the OMCTS and TEOS used in conventional hardmasks. As shown in FIG. 4, the improved hardmask may also be formed in one continuous process, unlike conventional hardmasks, which require multiple process steps and tools sets to form layers with different compositions. The improved hardmask drastically improves the etch profile for devices that utilize back end of the line (BEOL) metallization with profiles of 14 nm or lower. The process described in the present invention may be extended to form BEOL interconnections with 10 nm profiles or even smaller.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A method comprising:
   forming a SiCOH hardmask on a semiconductor substrate using a continuous plasma enhanced chemical vapor deposition (PECVD) process, wherein the forming a SiCOH hardmask comprises:
   forming an oxide adhesion layer on a surface of a substrate in a first step by introducing oxygen at a steady high flow rate, and introducing a silicon precursor at a steady lower flow rate into a reaction chamber, wherein the oxide adhesion layer comprises oxygen rich silicon oxide;

forming a graded transition layer on the oxide adhesion layer in a second step by introducing a porogen at an increasing flow rate, reducing the flow rate of oxygen to a level below the flow rate of the porogen and the flow rate of the silicon precursor, and increasing the flow rate of the silicon precursor to a level above the flow rate of oxygen and the flow rate of the porogen, wherein the graded transition layer comprises a high concentration of oxygen in the region contacting the oxide adhesion layer and a gradually decreasing concentration of oxygen towards upper surface;

forming a dielectric layer on the graded transition layer in a third step by maintaining a steady high flow rate of the silicon precursor at a level above the flow rate of the porogen and the flow rate of oxygen, maintaining a steady low flow rate of oxygen at a level below the flow rate of the silicon precursor and the flow rate of the porogen, and maintaining a steady intermediate flow rate of the porogen at a level below the flow rate of the silicon precursor and above the flow rate of oxygen;

forming an inverse graded transition layer on the dielectric layer in a fourth step by increasing the flow rate of oxygen to a level above the flow rate of the silicon precursor and the flow rate of the porogen, reducing the flow rate of the silicon precursor to a level below the flow rate of oxygen, and reducing the flow rate of the porogen to zero, wherein the inverse graded transition layer comprises a low concentration of oxygen in the region contacting the dielectric layer and a gradually increasing concentration of oxygen towards an upper surface; and forming an oxide layer on the inverse graded transition layer in a fifth step by maintaining the flow rate of oxygen at a steady high flow rate, and maintaining a steady lower flow rate of the silicon precursor, wherein the oxide layer comprises oxygen rich silicon oxide.

2. The method of claim 1, wherein:

the first step is performed for a duration of approximately 0.5 s to approximately 2 s;

the second step is performed for a duration of approximately 0.5 s to approximately 5 s;

the third step is performed for a duration of approximately 5 s to approximately 50 s;

the fourth step is performed for a duration of approximately 0 s to approximately 30 s; and the fifth step is performed for a duration of approximately 0.5 s to 30 s.

3. The method of claim 1, wherein the silicon precursor comprises a molecule containing Si, C, O, and H atoms.

4. The method of claim 1, wherein the silicon precursor comprises a silane ($SiH_4$) derivative having the molecular formula SiRR'R"R'" wherein R, R', R", and R'" are selected from a group consisting of H, alkyl, alkoxy, methyl, ethyl, methoxyl, and ethoxyl.

5. The method of claim 1, wherein the silicon precursor comprises a silicon methylene ($SiCH_2$) derivative having the molecular formula RR'R'Si—CH2-SiRR'R" wherein R, R', R" are selected from a group consisting of H, alkyl, alkoxy, methyl, ethyl, methoxyl, and ethoxyl.

6. The method of claim 1, wherein the silicon precursor comprises an organic molecule with a ring structure containing SiCOH components selected from a group consisting of 1,3,5,7-tetramethylcyclotrasiloxane (TMCTS or $CH_4H_{16}O_4Si_4$), octamethylcyclotetrasiloxane (OMCTS), diethoxymethylsilane (DEMS), dimethyldimethoxysilane (DMDMOS), and diethylmethoxysilane (DEDMOS).

7. The method of claim 1, wherein the porogen comprises a hydrocarbon selected from a group consisting of cyclic unsaturated hydrocarbons, linear alkenes, cycloalkene oxides, a-terpinene (ATRP), methylmethacrylate (MMA), bicycloheptadiene (BCHD), and hexadiene (HXD).

8. The method of claim 1, further comprising forming at least one conductive feature in the SiCOH hardmask, the conductive feature comprising an electrical contact, a via, a line, or a combination thereof.

9. The method of claim 1, wherein the silicon precursor contains a sacrificial organic porogen group present as an R group, the sacrificial organic porogen group being directly connected to the silicon precursor or connected to the silicon precursor by a linker group.

10. The method of claim 9, wherein the sacrificial organic porogen group is comprised of a branched alkyl, cyclic alkyl, branched alkoxy, cyclic alkoxy, aldehyde, ketone, ester, thioester, amine, urethane, nitrite, azo derivative, triphenyl, cycloheptatrienyl, or alkyl group.

\* \* \* \* \*

UNITED STATES PATENT AND TRADEMARK OFFICE
CERTIFICATE OF CORRECTION

| | | |
|---|---|---|
| PATENT NO. | : 8,927,442 B1 | Page 1 of 1 |
| APPLICATION NO. | : 13/951321 | |
| DATED | : January 6, 2015 | |
| INVENTOR(S) | : Angyal et al. | |

It is certified that error appears in the above-identified patent and that said Letters Patent is hereby corrected as shown below:

On the title page, under (73) Assignee, "International Business Machines Corporation, Armonk, NY (US)" should read --International Business Machines Corporation, Armonk, NY (US); STMicroelectronics, Inc., Coppell, TX (US)--.

Signed and Sealed this
Thirteenth Day of October, 2015

Michelle K. Lee
*Director of the United States Patent and Trademark Office*